(12) United States Patent
Heo

(10) Patent No.: US 6,555,917 B1
(45) Date of Patent: Apr. 29, 2003

(54) SEMICONDUCTOR PACKAGE HAVING STACKED SEMICONDUCTOR CHIPS AND METHOD OF MAKING THE SAME

(75) Inventor: Young Wook Heo, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/974,541

(22) Filed: Oct. 9, 2001

(51) Int. Cl.$^7$ .......................... H01L 29/40; H01L 23/52
(52) U.S. Cl. ...................... 257/777; 257/685; 257/686; 257/786
(58) Field of Search ................. 257/777, 685, 257/686, 723, 782, 784, 786, 783; 438/109

(56) References Cited

U.S. PATENT DOCUMENTS

| | | | |
|---|---|---|---|
| 4,763,188 A | 8/1988 | Johnson | 357/74 |
| 5,012,323 A | 4/1991 | Farnworth | 357/75 |
| 5,025,306 A | 6/1991 | Johnson, et al. | 357/75 |
| 5,291,061 A | 3/1994 | Ball | 257/686 |
| 5,323,060 A | 6/1994 | Fogal et al. | 257/777 |
| 5,347,429 A | 9/1994 | Kohno et al. | 361/813 |
| 5,422,435 A | 6/1995 | Takiar et al. | 174/52.4 |
| 5,438,224 A * | 8/1995 | Papageorge et al. | 257/777 |
| 5,463,253 A | 10/1995 | Waki et al. | 257/724 |
| 5,474,958 A | 12/1995 | Djennas et al. | 437/211 |
| 5,495,398 A | 2/1996 | Takiar et al. | 361/790 |
| 5,502,289 A | 3/1996 | Takiar et al. | 174/266 |
| 5,646,828 A | 7/1997 | Degani et al. | 361/715 |
| 5,689,135 A | 11/1997 | Ball | 257/676 |
| 5,696,031 A | 12/1997 | Wark | 437/209 |
| 5,715,147 A | 2/1998 | Nagano | 361/813 |
| 5,721,452 A | 2/1998 | Fogal et al. | 257/685 |
| 5,739,581 A | 4/1998 | Chillara et al. | 257/668 |
| 5,793,108 A | 8/1998 | Nakahishi et al. | 257/723 |
| 5,815,372 A | 9/1998 | Gallas | 257/760 |
| 5,866,949 A | 2/1999 | Schueller | 257/778 |

(List continued on next page.)

FOREIGN PATENT DOCUMENTS

| | | | |
|---|---|---|---|
| EP | 503 201 A2 | 12/1991 | ......... H01L/23/495 |
| JP | 56062351 | 5/1981 | ........... H01L/25/04 |
| JP | 60182731 | 9/1985 | ........... H01L/21/60 |
| JP | 61117858 | 6/1986 | ........... H01L/25/08 |
| JP | 62-126661 | 6/1987 | ........... H01L/25/04 |
| JP | 63128736 | 6/1988 | ........... H01L/23/04 |
| JP | 63-244654 | 10/1988 | ........... H01L/23/28 |
| JP | 1028856 | 1/1989 | ........... H01L/27/00 |
| JP | 64001269 | 1/1989 | ........... H01L/25/04 |
| JP | 1071162 A | 3/1989 | ........... H01L/23/52 |
| JP | 1099248 A | 4/1989 | ........... H01L/25/08 |
| JP | 3169062 | 7/1991 | ......... H01L/25/065 |
| JP | 4028260 | 1/1992 | ......... H01L/25/065 |
| JP | 4-56262 | 2/1992 | ........... H01L/25/65 |
| JP | 4056262 | 2/1992 | ......... H01L/25/065 |
| JP | 4096358 | 3/1992 | ......... H01L/25/065 |
| JP | 4116859 | 4/1992 | ......... H01L/25/065 |
| JP | 5013665 | 1/1993 | ......... H01L/25/065 |
| JP | 5-75015 A | 3/1993 | ......... H01L/25/065 |
| JP | 5109975 | 4/1993 | ......... H01L/25/065 |
| JP | 5136323 | 6/1993 | ........... H01L/23/50 |
| JP | 6-21328 * | 1/1994 | ................ 257/777 |
| JP | 10-256470 | 9/1998 | ......... H01L/25/065 |

*Primary Examiner*—Jasmine J B Clark
(74) *Attorney, Agent, or Firm*—Skjerven Morrill LLP; James E. Parsons

(57) ABSTRACT

Embodiments of semiconductor packages containing a stack of at least two semiconductor chips are disclosed, along with methods of making the same. One embodiment includes a substrate, which may be a ball grid array substrate or a metal leadframe. The stack of semiconductor chips is mounted to the substrate. Each semiconductor chip has a plurality of bond pads on an active surface thereof. The bond pads of the first semiconductor chip face corresponding ones of the bond pads of the second semiconductor chip, and are joined thereto through an electrically conductive joint. One of a plurality of bond wires extend from each of the joints to the substrate. Accordingly, pairs of bond pads of the first and second semiconductor chips are electrically interconnected, and are electrically connected to the substrate through the respective bond wire.

23 Claims, 10 Drawing Sheets

U.S. PATENT DOCUMENTS

| | | |
|---|---|---|
| 5,886,412 A | 3/1999 | Fogal et al. ............... 257/777 |
| 5,973,403 A | 10/1999 | Wark ........................ 257/777 |
| 5,977,640 A | 11/1999 | Bertin et al. ............... 257/777 |
| 6,005,778 A | 12/1999 | Spielberger et al. ........ 361/770 |
| 6,025,640 A | 2/2000 | Yagi et al. ................. 257/666 |
| RE36,613 E | 3/2000 | Ball ........................... 257/777 |
| 6,051,886 A | 4/2000 | Fogal et al. ............... 257/777 |
| 6,057,598 A | 5/2000 | Payne et al. ............... 257/723 |
| 6,060,778 A | 5/2000 | Jeong et al. ............... 257/710 |
| 6,072,243 A | 6/2000 | Nakanishi .................. 257/783 |
| 6,080,264 A | 6/2000 | Ball ........................... 156/292 |
| 6,130,115 A | 10/2000 | Okumura et al. .......... 438/124 |
| 6,133,637 A | 10/2000 | Hikita et al. ............... 257/777 |
| 6,172,419 B1 | 1/2001 | Kinsman .................... 257/737 |
| 6,198,171 B1 | 3/2001 | Huang et al. .............. 257/787 |
| 6,214,641 B1 | 4/2001 | Akram ....................... 438/107 |
| 6,225,146 B1 | 5/2001 | Yamaguchi et al. ....... 438/123 |
| 6,229,200 B1 | 5/2001 | Mclellan et al. ........... 257/666 |
| 6,233,429 B1 | 5/2001 | Kaneda et al. ............. 29/832 |
| 6,242,281 B1 | 6/2001 | Mclellan et al. ........... 438/106 |
| 6,281,568 B1 | 8/2001 | Glenn et al. ............... 257/684 |
| 6,326,696 B1 | 12/2001 | Horton et al. .............. 257/777 |
| 6,400,007 B1 * | 6/2002 | Wu et al. ................... 257/686 |

* cited by examiner

SEMICONDUCTOR PACKAGE HAVING STACKED SEMICONDUCTOR CHIPS AND METHOD OF MAKING THE SAME

BACKGROUND

1. Field of the Invention

The invention relates generally to semiconductor packaging, and specifically to semiconductor packages having stacked semiconductor chips.

2. Description of Related Art

A typical semiconductor package includes a semiconductor chip mounted to a substrate. The substrate may be a metal leadframe with radiating metal leads, or an insulative sheet with metal traces on the sheet and conductive balls serving as the input/output terminals of the package. The chip includes an active surface with rows of bond pads along the peripheral edges of the active surface, and an inactive surface opposite the active surface. The bond pads of the active surface are each electrically connected to the substrate by electrical conductors, such as wire bonds or TAB bonds. The bond pads also may be electrically connected to the substrate in a flip chip style electrical connection, in which case the bond pads face the leads or traces of the substrate and are electrically connected thereto. A hardened insulative encapsulant material covers the chip and a portion of the substrate.

As computers and other types of electronic products become physically more compact and operate at faster speed, miniaturization of components and greater packaging density has become desirable. One approach to meeting this need has been to stack a plurality of chips in one package. Each of the chips is electrically connected to the substrate, and often the chips are electrically connected to each other, especially in memory applications. Where the bottom chip of a stack has a larger horizontal surface area than the top chip of the stack, it is easy to electrically connect the chips to the substrate, since the bond pads of both the upper and lower chips are accessible to a wire bonding machine. However, where the two chips are the same size in that they have the same horizontal surface area, e.g., the chips are identical memory chips, stacking is problematic because of interference between the bond wires connected to the lower chip and the upper chip. One approach to resolving such problems has been to attach a relatively thick spacer (e.g., an adhesive layer or film, or a silicon pad) between the active surface of the lower clip and the inactive surface of the upper chips to provide clearance for wire bonds to the lower chip. However, such a spacer increases package height, among other possible drawbacks. Accordingly, there is a need for a new approach to stacking two or more same size chips in a thin semiconductor package.

SUMMARY

The present invention includes semiconductor packages that have at least a pair of semiconductor chips stacked one on top of the other. The stacked semiconductor chips are electrically connected to an interconnective substrate, such as a BGA or LGA style substrate or a metal leadframe. Methods of making such packages are also within the present invention.

In one embodiment, first and second semiconductor chips of the same size and type are provided, with each having an active surface with peripheral bond pads and an opposite inactive surface. The inactive surface of the first semiconductor chip is attached to the substrate. Bond pads of the first semiconductor chip are electrically connected to the substrate using bond wires. A standoff stitch bonding technique may be used to connect the bond wires to the bond pads, resulting in a metal bump on the respective bond pad and a low angle bond wire. The second semiconductor chip is provided with metal bumps on its bond pads. The second semiconductor chip is superimposed over the first semiconductor chip so that the metal bumps and underlying bond pads of the second semiconductor chip are each juxtaposed with a corresponding metal bump and underlying bond pad of the first semiconductor chip. The juxtaposed pairs of metal bumps are fused, resulting in an electrical interconnection of the corresponding bond pads of first and second semiconductor chips and an electrical connection through the respective bond wire to the substrate. An alternative embodiment replaces the metal bumps of the second semiconductor chip with a layer of an anisotropic conductive film.

The present invention is best understood by reference to the following detailed description when read in conjunction with the accompanying drawings.

BRIEF DESCRIPTION OF THE FIGURES

Common reference numerals are used throughout the drawings and detailed description to indicate like elements.

DETAILED DESCRIPTION

Figure 1:
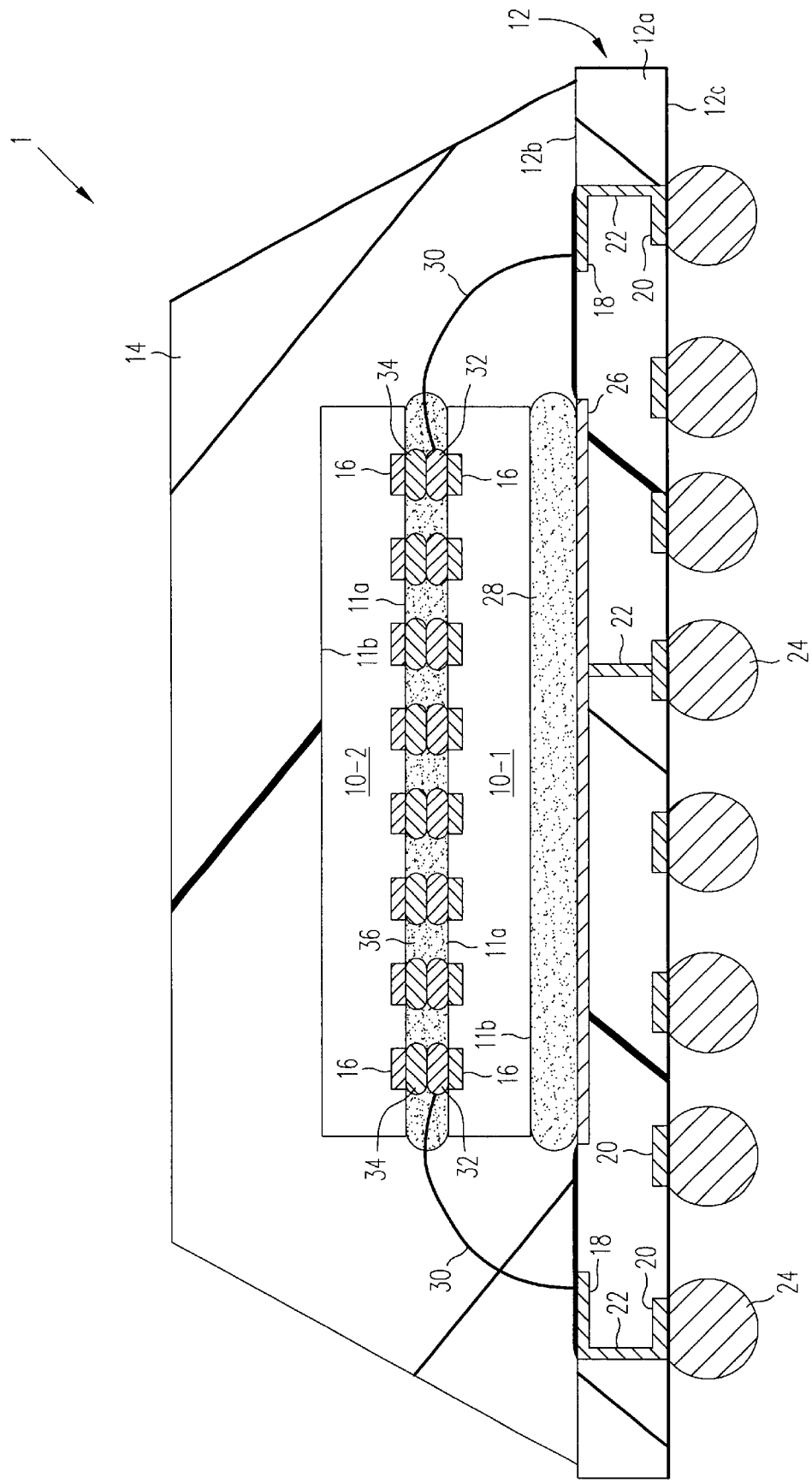
FIG. 1 is a cross-sectional side view of a semiconductor package including two stacked semiconductor chips in accordance with the present invention.

FIG. 1 depicts a semiconductor package 1 including two stacked semiconductor (e.g., silicon) chips of the same size, first chip 10-1 and second chip 10-2, mounted to a substrate 12 in accordance with the present invention. Chips 10-1 and 10-2 are electrically interconnected, and also are electrically connected to substrate 12. An insulative, protective encapsulant material 14 covers chips 10-1, 10-2 and the underlying substrate 12.

Figure 2:
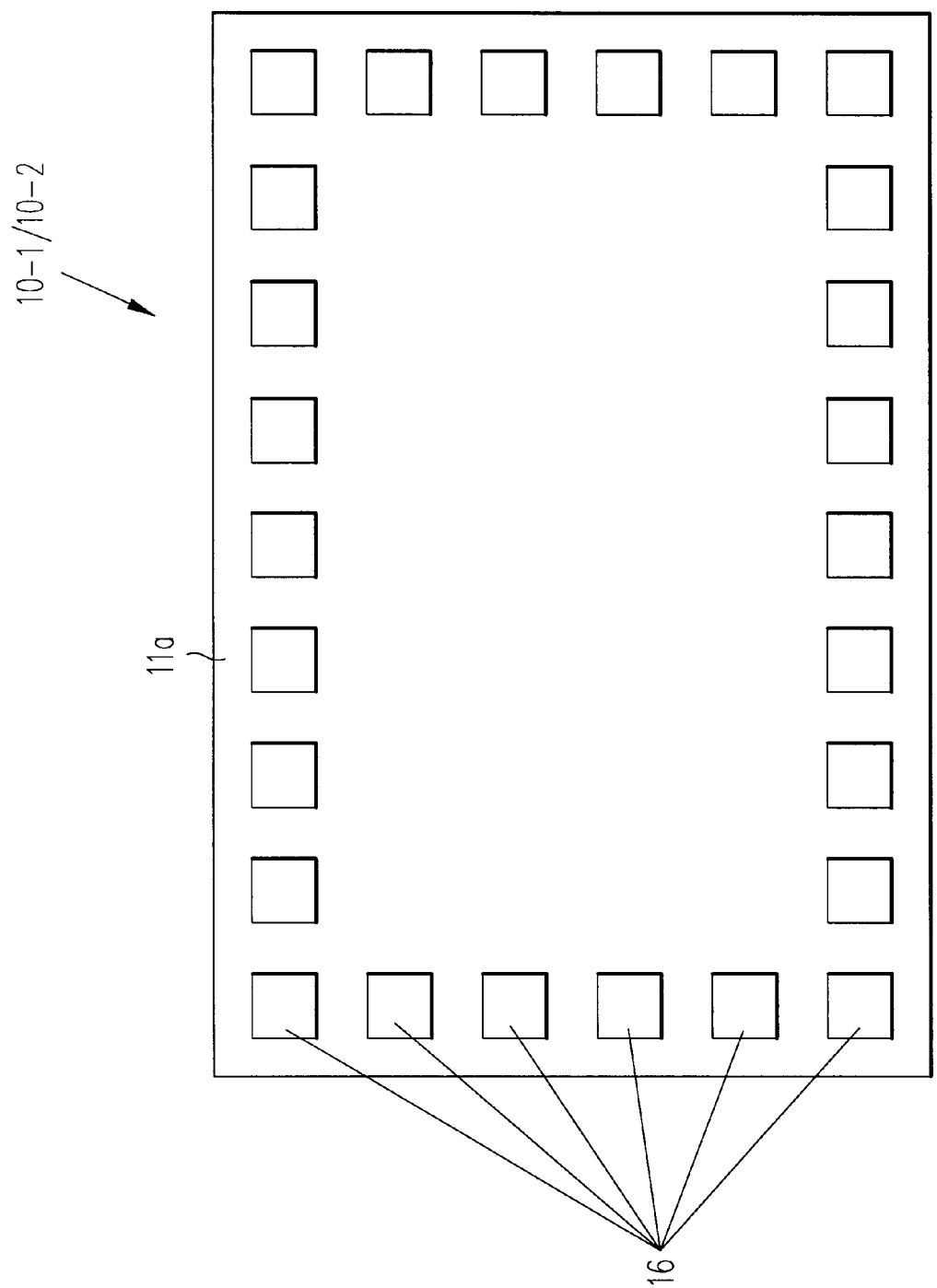
FIG. 2 is a plan view of a semiconductor chip of FIG. 1.

Referring to FIGS. 1 and 2, chips 10-1, 10-2 include an active surface 11a, and an opposite inactive surface 11b. Active surface 11a includes a plurality of bond pads 16, which in this case are aligned in a single row along each of the four peripheral edges active surface 11a. Bond pads 16 are input/output terminals of chips 10-1, 10-2. Inactive surface 11b may be polished or etched to thin chips 10-1, 10-2, thereby allowing a thinner package.

As an example, chips 10-1 and 10-2 may be identical memory chips, except that the bond pads 16 of chip 10-2 are redistributed to be a mirror image of the bond pads 16 of chip 10-1. Accordingly, chips 10-1 and 10-2 can be electrically interconnected in parallel when their active surfaces 11a are juxtaposed, as shown in FIG. 1. Alternatively, chips 10-1 and 10-2 can be different chips, e.g., a memory and a logic chip, that are the same size.

Figure 3:
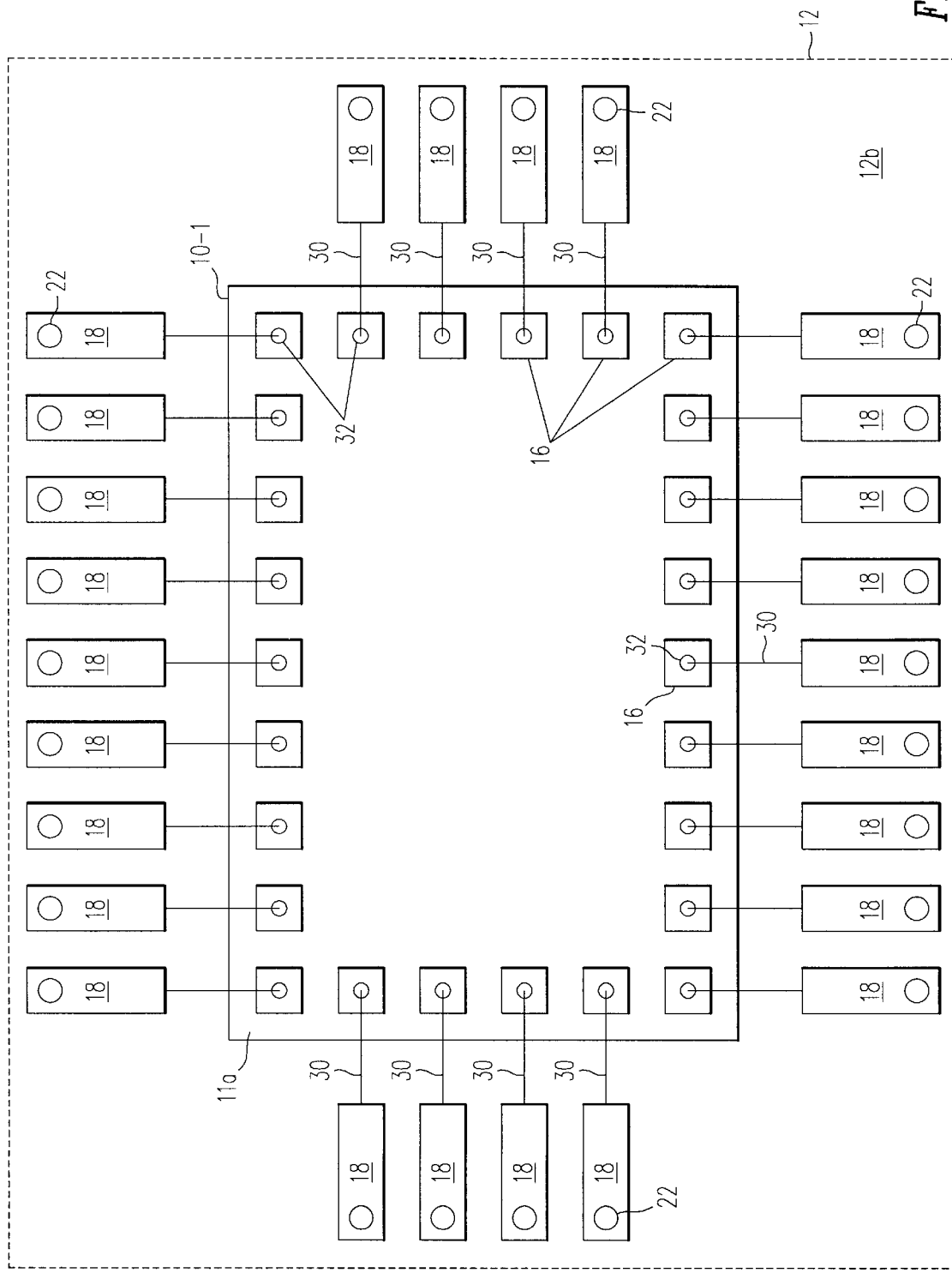
FIG. 3 is a plan view of the lower semiconductor chip of FIG. 1 mounted on a substrate.

FIG. 3 is a top plan view of chip 10-1 of FIG. 1. Bond pads 16 of chip 10-1 are electrically connected to substrate 12. In this example, substrate 12 is typical of a ball grid array (BGA) or land grid array (LGA) package, in that substrate 12 includes an insulative core layer 12a with electrically conductive first and second circuit patterns 18 and 20 on opposed first and second surfaces 12b and 12c of substrate 12, respectively. Electrically conductive vias 22 extend vertically through substrate 12 and electrically connect first circuit patterns 18 to second circuit patterns 20. Optional conductive balls 24 that are fused to second circuit patterns 20 may serve as input/output terminals for a BGA package. Core layer 12a may be bismaleimide triazine (BT) resin, a glass-fiber filled epoxy resin, ceramic, polyimide, or many other conventional insulative materials. Circuit patterns 18 and 20 and vias 22 may be formed of copper or other metals.

In FIGS. 1 and 3, first chip 10-1 is mounted on a metal die pad 26 of first surface 12b of substrate 12. A layer of an adhesive material 28 attaches inactive surface 11b of first chip 10-1 to die pad 26. Bond wires 30, which may be formed of gold, electrically connect respective bond pads of chip 10-1 to respective first circuit patterns 18 of first surface 12b. A stitch standoff bonding technique may be used to electrically connect bond wires 30 between bond pads 16 and first circuit patterns 18.

Referring to FIG. 1, chip 10-2 is in an inverted position relative to chip 10-1 and is superimposed over chip 10-1 so that their respective active surfaces 11a and bond pads 16 are juxtaposed for electrical interconnection. Chip 10-1 has metal bumps 32 formed on its bond pads 16, and bond wires 30 extend from metal bumps 32. Chip 10-2 has metal bumps 34 formed on its bond pads 16. Metal bumps 34 are juxtaposed with metal bumps 32, and are fused to metal bumps 32. Accordingly, pairs of juxtaposed metal bumps 32 and 34 are electrically interconnected in a joint, and are each electrically connected by the respective bond wire 30 extending from the joint to respective first circuit patterns 18 of substrate 12. Metal bumps 32, 34 and bond wires 30 may be formed of gold, among other possible metals. Because chips 10-1 and 10-2 are electrically interconnected in a flip chip style, it is not necessary to have a second set of bond wires for second chip 10-2, which allows for a thin package.

Optionally, an adhesive insulative underfill material 36 may be provided between the juxtaposed active surfaces 11a of chips 10-1, 10-2 so as to surround each of the pairs of interconnected metal bumps 32, 34. The underfill material 36 can enhance the attachment between the chips 10-1, 10-2, and can protect the electrical interconnections and surfaces of chips 10-1, 10-2. Further, the underfill material 36 also may facilitate a molding or other encapsulation process. The height of the space between chips 10-1 and 10-2 is larger than a diameter of bond wire 30. Metal bumps 32, 34 typically will have a height of 0.5 to two times the diameter of a gold bond wire 30.

In an alternative embodiment, chips 10-1 and 10-2 may include bond pads and metal bumps that are located within the perimeter defined by the rectangle of bond pads 16. Such juxtaposed centrally located bond pads may be electrically interconnected in a joint of fused metal bumps 32, 34, even though such central bond pads are not electrically 5 connected by a bond wire to substrate 12.

Figure 4:
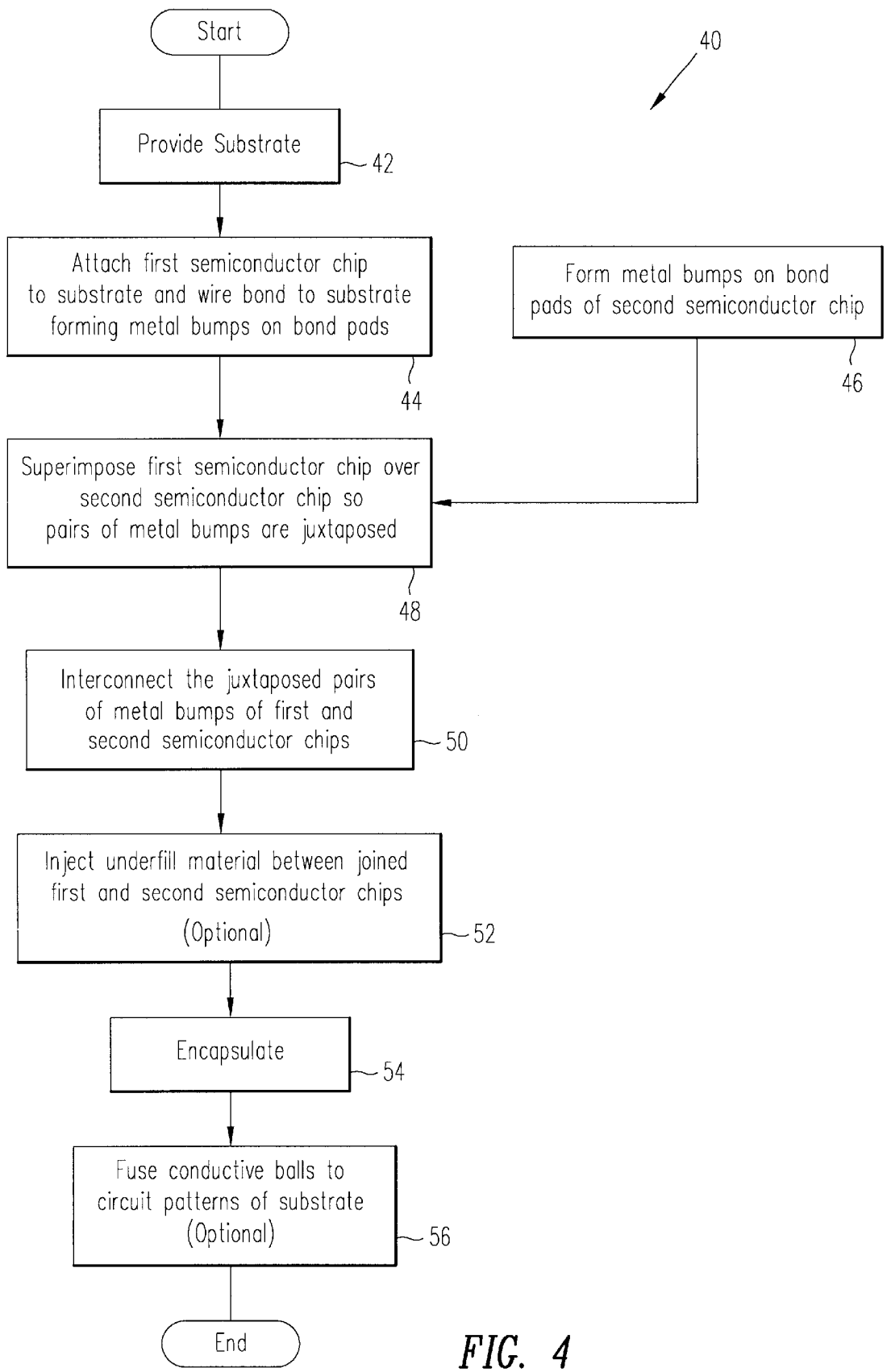
FIG. 4 is a flowchart of a method of making a semiconductor package in accordance with the present invention.

FIG. 4 is a flowchart of an exemplary method 40 of building semiconductor package 1 of FIG. 1. Referring to FIGS. 1 and 4, method 40 includes, at step 42, providing a substrate upon which to mount chip 10-1. As mentioned, the exemplary substrate 12 is a conventional BGA or LGA substrate, but may be any other substrate used for semiconductor packaging, such as a metal leadframe having a central die pad and radiating leads. Substrate 12 also could be a motherboard to which chips 10-1, 10-2 are mounted with other semiconductor packages and electronic components.

At step 44 of FIG. 4, first chip 10-1 is mounted on substrate 12, and electrically connected to substrate 12. First chip 10-1 is fixed to substrate 12 using any conventional die attach method, such as using an adhesive layer 8 that is an epoxy resin or an adhesive film.

Respective bond pads 16 of chip 10-1 may be wire bonded to respective first circuit patterns 18 of first surface 12b of substrate 12 using a standoff stitch bonding technique or a wedge bonding technique.

Figure 5:
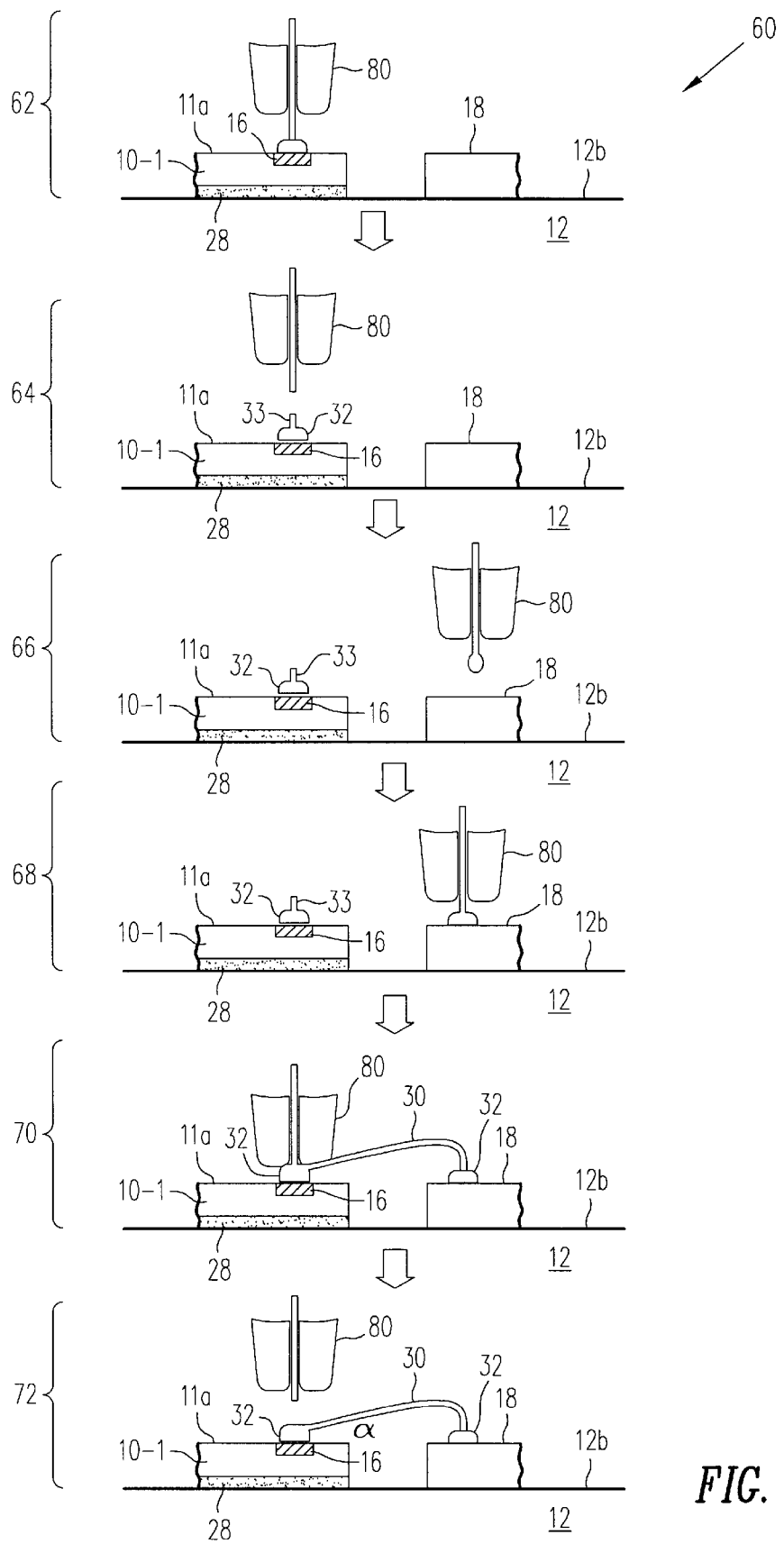
FIG. 5 depicts a wire-bonding process that may be used for the present invention.

FIG. 5 illustrates an exemplary stand off stitch bonding method 60. In step 62 of method 60 of FIG. 5, a bonding machine capillary 80 deposits a metal ball, typically gold but possibly aluminum or some other metal, on a bond pad 16 of chip 10-1. In step 64, after fusing metal bump 32 to the bond pad 16 and beginning to draw a wire from bump 32, bonding machine capillary 80 severs the wire, leaving a short tail 33. Thereafter, in steps 66 and 68, bonding machine capillary 80 is positioned on a first circuit pattern 18, and forms another metal bump 32. In steps 70 and 72, wire 30 is drawn from the second bump 32 and is fused to metal bump 32 of chip 10-1, which eliminates tail 33 and electrically connects the first circuit pattern 18 to bond pad 16 of chip 10-1. The angle α of wire 30 relative to active surface 11a of chip 10-1 is low, which allows second chip 10-2 to be superimposed over first chip 10-I without interfering with bond wire 30. As an example, angle a may be between about 0 degrees and about 30 degrees. Typically, wire 30 will extend outward at a height equal to or higher than metal bump 32.

Returning to FIG. 4, at step 46, a metal bump 34 is formed on each of the bond pads 16 of second chip 10-2. Metal bumps 34 with a short tail 33 (see FIG. 6) may be formed on bond pads 16 of chip 10-2 using the steps 62 and 64 of FIG. 5.

Figure 6:
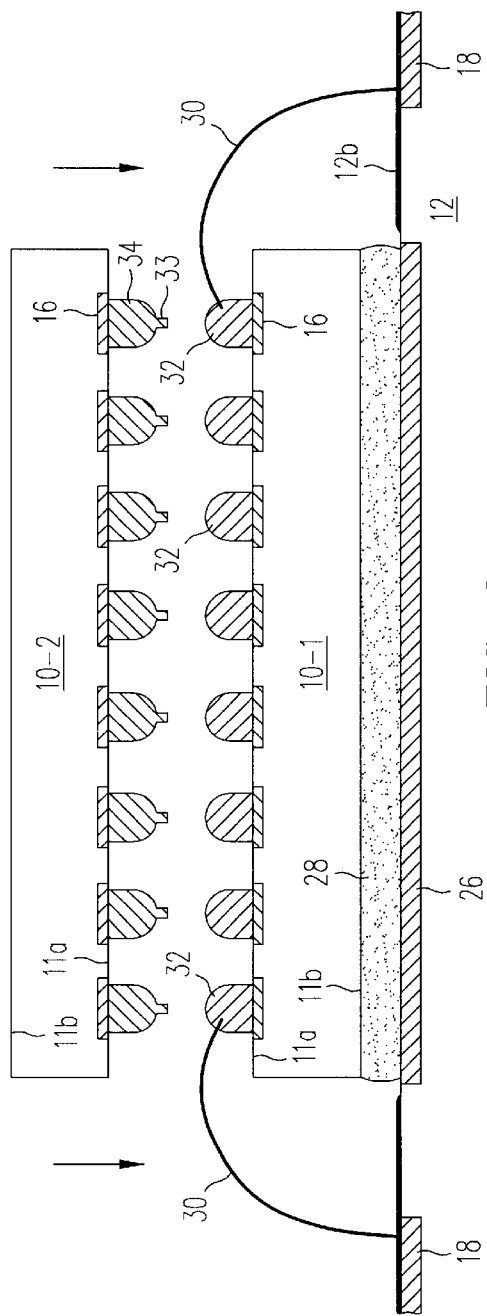
FIG. 6 is a cross-sectional side view of the two semiconductor chips of FIG. 1 in the process of being stacked in accordance with the present invention.

Subsequently, in step 48 of FIG. 4, second chip 10-2 is superimposed over first chip 10- 1. Referring to FIG. 6, a conventional pick and place machine is used to position active surface 11a of second chip 10-2 over active surface 11a of first chip 10-1 in a manner that juxtaposes bond pads 16 and metal bumps 34 of second chip 10-2 with corresponding bond pads 16 and metal bumps of first chip 10-1.

In step 50 of FIG. 4, pressure and/or heat are applied to electrically interconnect the respective juxtaposed pairs of metal bumps 32 and 34. For instance, after placing second chip 10-2 on first chip 10-1, substrate 12 and the chips 10-1, 10-2 thereon may be placed in a reflow oven at elevated temperature to fuse bumps 32 and 34, thereby interconnecting respective bumps 32 and 34 and the associated wire 30 in an electrically conductive joint.

In optional step 52 of FIG. 4, underfill material 36 may be injected with a syringe between joined first chip 10-1 and second chip 10-2. In an alternative method, a viscous insulative adhesive underfill material may be applied onto active surface 11a of first chip 10-2 or second chip 10-2 after metal bumps 32 or 34 are formed, but prior to stacking chips 10-1 and 10-2 in step 50 of FIG. 4. The underfill material is then partially cured to a β stage. Subsequently, in step 50, the heating of metal balls 32 and 34 to fuse them to each other will melt and fully cure the underfill material.

Subsequently, in step 54, chips 10-1 and 10-2, wires 30, optional underfill material 36, and a portion of substrate 12 are encapsulated in encapsulant material 14. Molding or liquid encapsulation techniques may be used.

In step 56, optional conductive balls 24 may be fused to lands of second circuit patterns 20 of second surface 11b of substrate 12. Of course, if substrate 10 is a metal leadframe rather than a BGA or LGA type substrate, steps that typically follow an encapsulation step are debar, dejunk, and trim and form steps.

Practitioners will appreciate that substrate 12 may be part of a larger sheet of interconnected substrates, which are assembled in parallel, and then are singulated by sawing, punching, or snapping from the larger sheet to form individual packages.

Alternatively, instead of using metal bumps 34 on chip 10-2, a layer of an anisotropic conductive film (ACF) may be employed. The ACF layer is an amalgamation of a conventional bonding film and conductive metal grains. A thickness of the bonding film may be about 50 $\mu$m, and a diameter of each conductive metal grain may be about 5 $\mu$m. The metal grains are coated with a thin polymer layer. If heat or pressure is applied to a predetermined region of the anisotropic conductive film, the thin polymer layer of the conductive metal grains in the predetermined region is melted so that adjacent metal grains become connected, thereby providing electrical conductivity. The thin polymer layer of the remaining conductive metal grains, i.e., those not included in the predetermined region, are maintained in an insulated status. Therefore, a position setting operation between two component elements to be electrically connected can be implemented in an easy manner.

Figure 7:
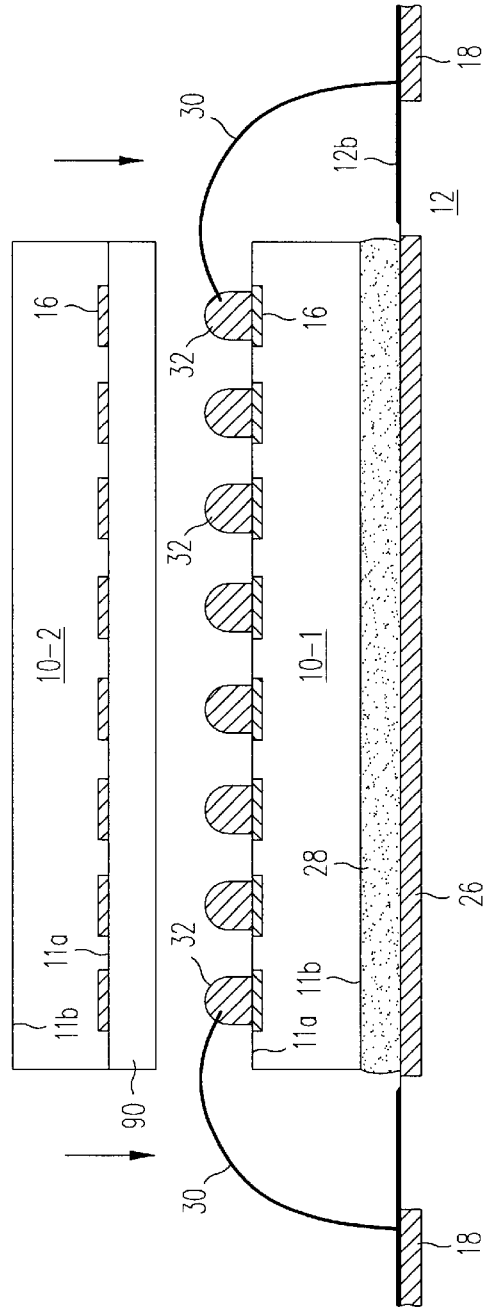
FIG. 7 is a cross-sectional side view of two semiconductor chips being stacked in accordance with the present invention.

Referring to FIG. 7, an ACF layer 90 is applied over active surface 11a of chip 10-2, which is then superimposed over and juxtaposed with active surface 11a of chip 10-1 of FIG. 2. As mentioned, chip 10-1 is wirebonded using a stitch standoff bonding technique that forms bumps 32 on bond pads 16 of chip 10-1. With the ACF layer 90 in contact with bumps 32 of chip 10-1, pressure and/or heat are applied so that an electrically conductive joint is made through a respective local region of the ACF layer 90 between each of bond pads 16 of chip 10-2, the respective underlying bump 32 of chip 10-1, and the respective wire bond 30 extending from the bump 32.

Figure 8A:
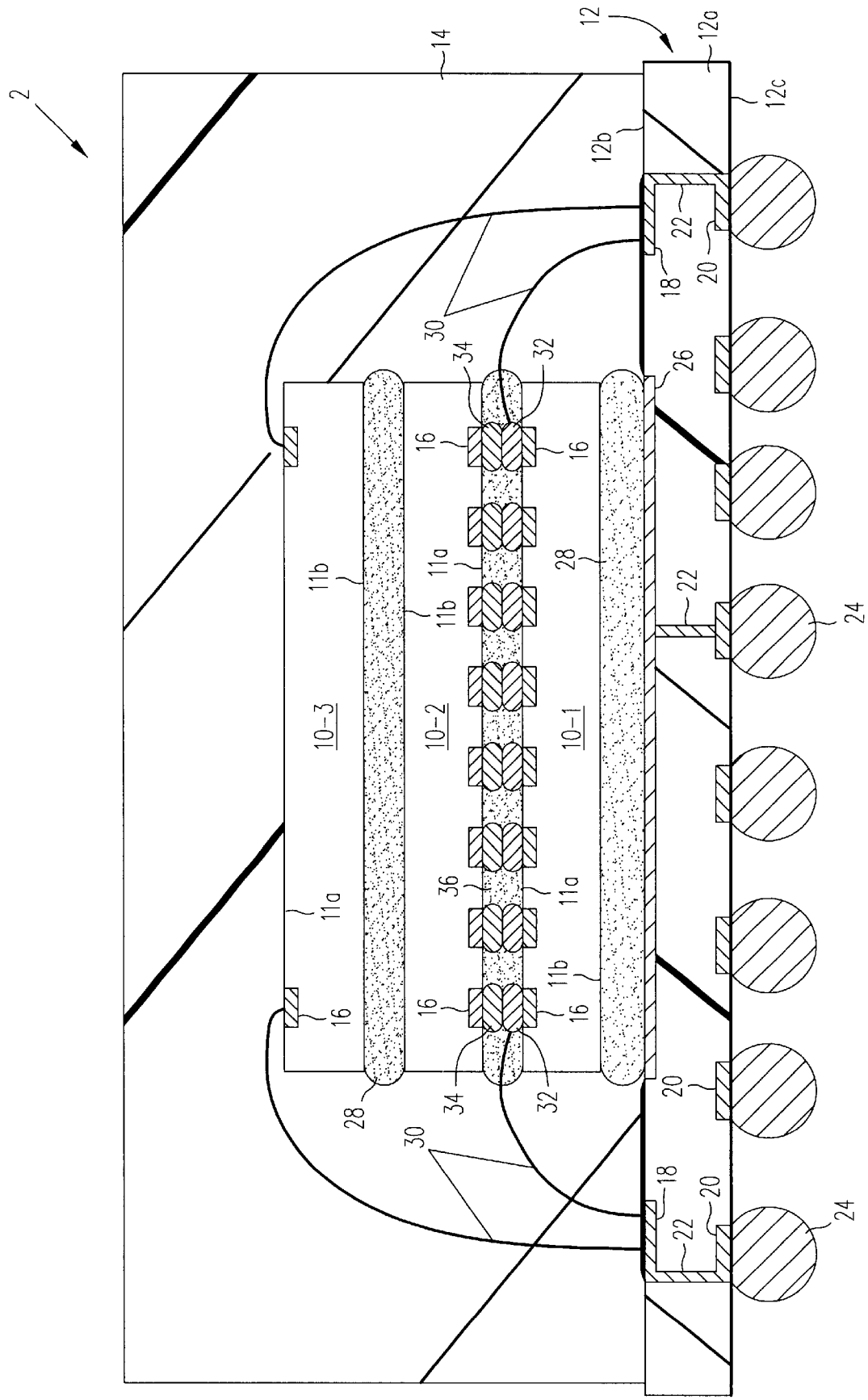
FIG. 8A and FIG. 8B are cross-sectional side views of alternative semiconductor packages in accordance with the present invention.
Figure 8B:
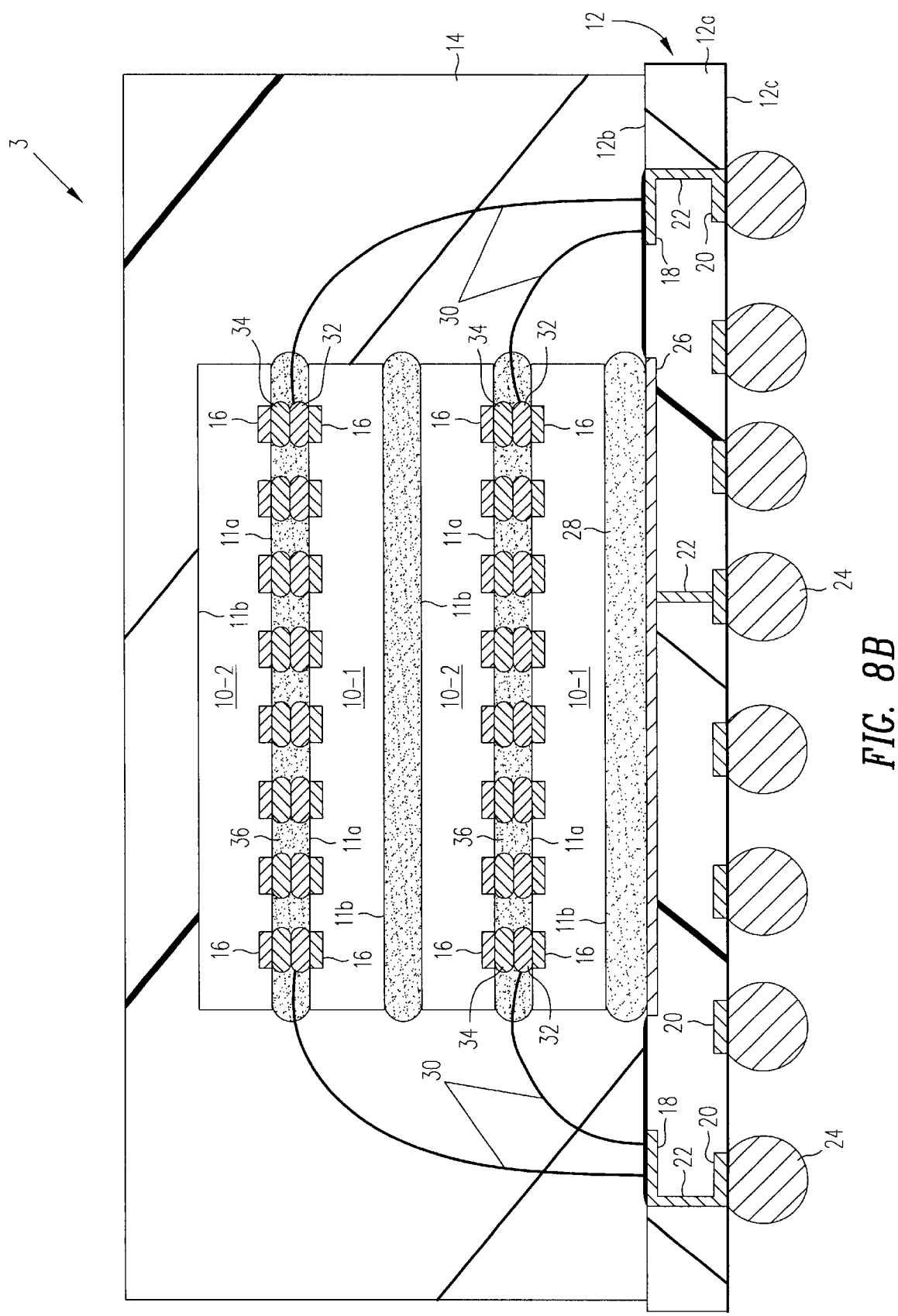

FIG. 8A and FIG. 8B depict exemplary embodiments of semiconductor packages within the present invention that include three and four chip layers, respectively, encapsulated in encapsulant material 14. In semiconductor package 2 of FIG. 8A, a third chip 10-3 is stacked on second chip 10-2. In particular, inactive surface 11b of a same size third chip 10-3 is juxtaposed with and attached to inactive surface 11b of a second chip 10-2 using an adhesive 28, such as an epoxy resin or an adhesive film. Subsequently, bond pads 16 of third chip 10-3 are electrically connected by another set of wires 30 to first circuit patterns 18 of substrate 12. In an alternative embodiment, third chip 10-3 need not be the same size or type as chips 10-1 and 10-2, but rather may be larger or smaller since its bond pads 16 are readily accessible for connection of wires 30.

In semiconductor package 3 of FIG. 8B, the method used to prepare and stack first chip 10-2 and second chip 10-2 is repeated for third chip 10-3 and fourth chip 10-4, respectively. Third chip 10-3 is mounted on second chip 10-2 as in FIG. 8A. Bond pads 16 of third chip 10-3 are then wirebonded to first circuit patterns 18 of substrate 12 using 10 a standoff stitch bonding technique. Finally, fourth chip 10-4 is superimposed over and electrically connected to third chip 10-3, as discussed above and as shown in FIGS. 4–6 The four chips 10-1, 10-2, 10-3, and 10-4 may all be thinned by polishing or etching their respective inactive surfaces 11b.

Figure 9:
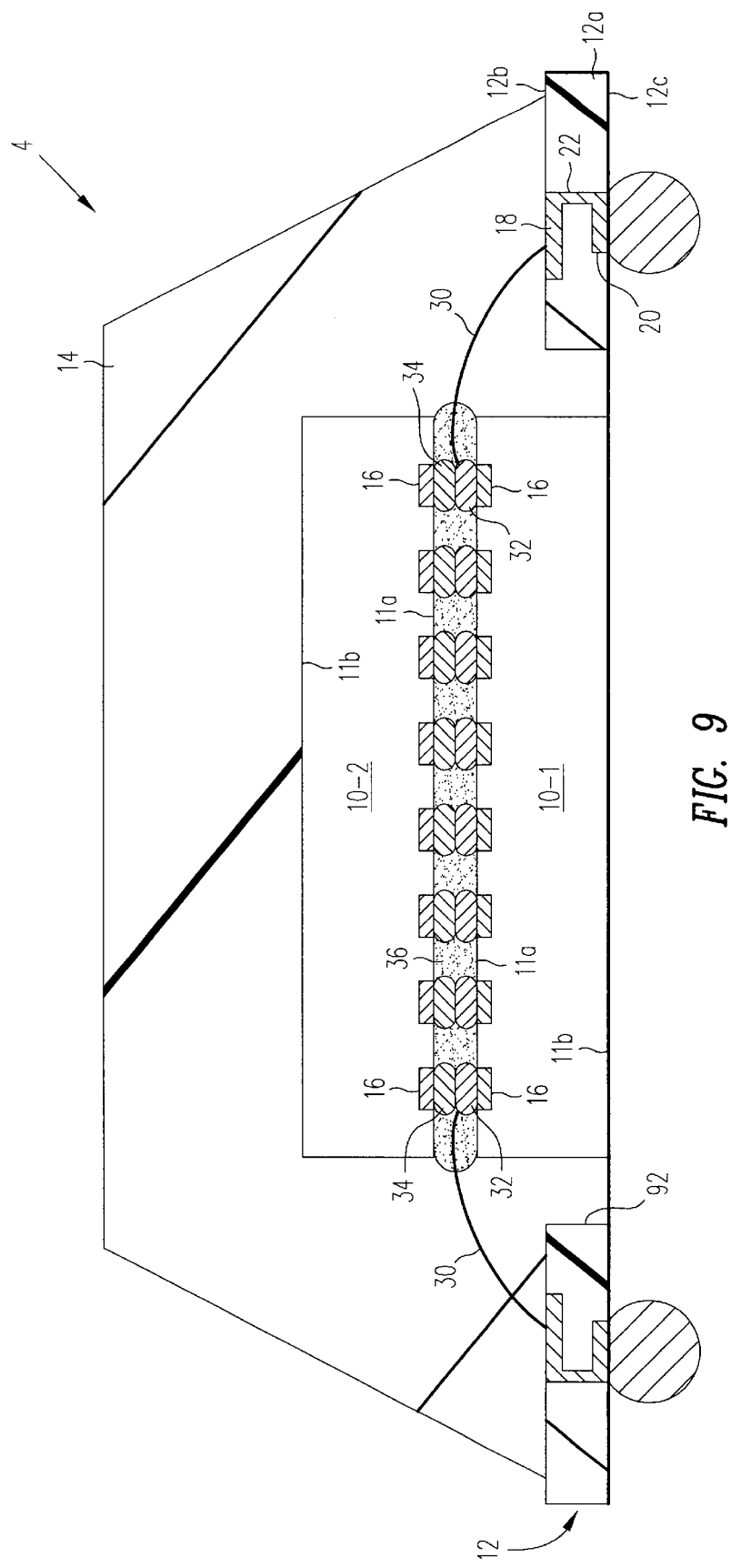
FIG. 9 is a cross-sectional side view of a semiconductor package in accordance with the present invention.

Practitioners will appreciate that the type of substrate of the semiconductor 15 package of the present invention may vary. For instance, a very thin version of a semiconductor package 4 within the present invention is shown in FIG. 9. In this instance, in place of die pad 26, substrate 12 includes a through hole 92 that extends between first and second surfaces 12b and 12c. Encapsulant 14 supports first chip 10-1 and second chip 10-2 within and over through hole 92. To make semiconductor package 20 4, a temporary tape is applied over through hole 92 at second surface 12c, and first chip 10-1 is adhesively supported on the temporary tape during steps 44, 48, 50, 52 and 54 of method 40 of FIG. 7. After the encapsulant material is hardened, the temporary tape is removed. Inactive surface 11b of first chip 10-1 is coplanar with second surface 12c of substrate 12 in this embodiment.

Figure 10:
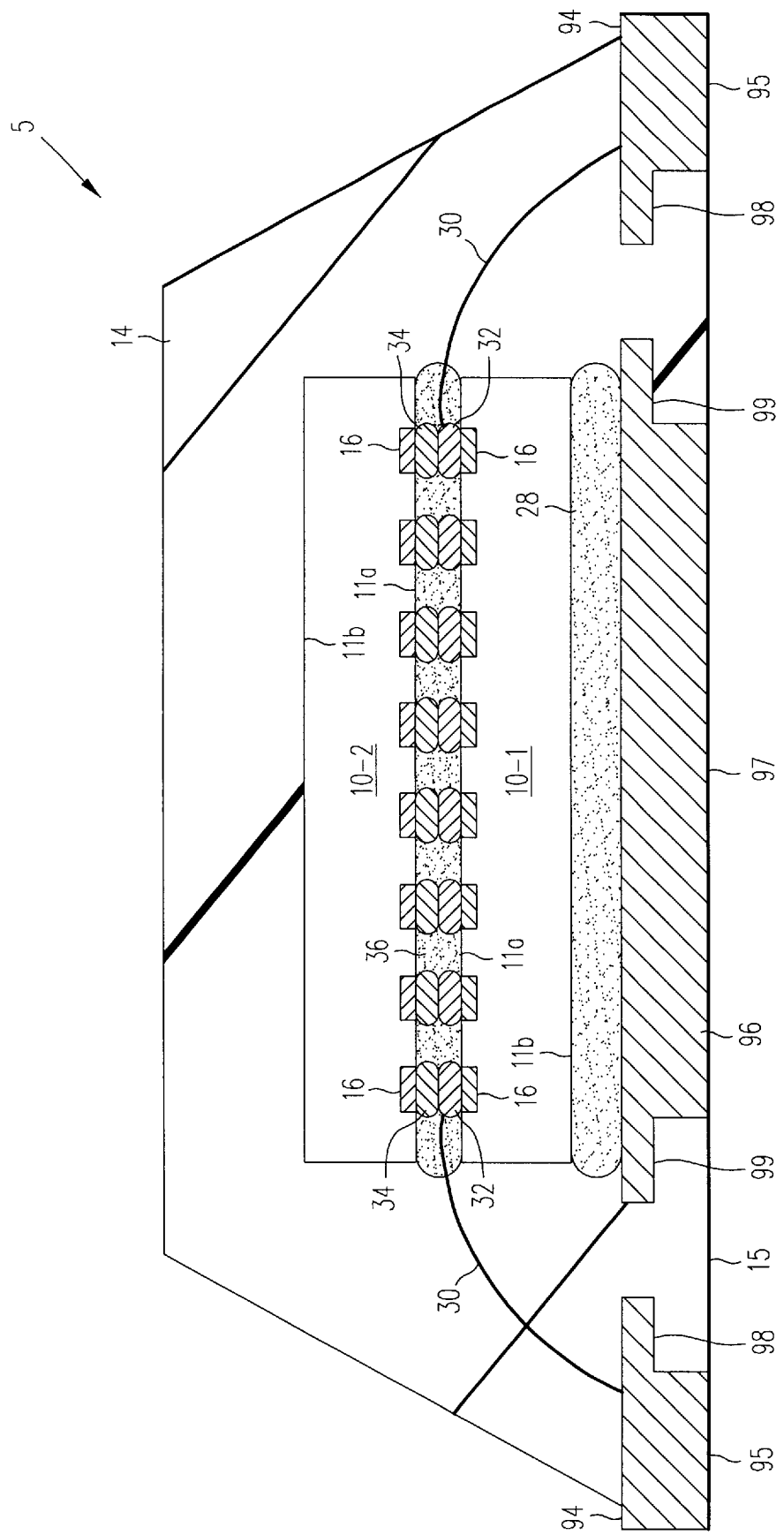
FIG. 10 is a cross-sectional side view of a semiconductor package in accordance with the present invention.

As another example, substrate 12 of FIG. 1 may be replaced by a rigid metal leadframe that includes a metal central die pad and metal leads that radiate outwards, as in a standard dual in-line package or quad package. Another type of leadframe semiconductor package is shown in FIG. 10. Semiconductor package 5 includes a plurality of metal leads 94 that extend horizontally outward from a central metal die pad 30 96. An inner end portion of lower surface 95 of leads 94 and a circumferential outer portion of lower surface 97 of die pad 96 include an undercut region 98 or 99 that is underfilled by encapsulant material 14. Accordingly, leads 94 and die pad 96 are locked to the package body. Meanwhile, lower surfaces 95 and 97 are exposed in the plane of lower horizontal exterior surface 15 of encapsulant material 14. Such a leadframe package can be very thin. Further information on such packages are disclosed in U.S. Pat. Nos. 6,143,981 and 6,281,568, which are incorporated herein by reference in their respective entireties.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:
1. An electronic assembly comprising:
   a stack of a first semiconductor chip and a second semiconductor chip, with the first and second semiconductor chips each having a plurality of bond pads, wherein each of the bond pads of the first semiconductor chip faces and is in one of a plurality of electrically conductive joints with a corresponding one of the bond pads of the second semiconductor chip; and
   a plurality of bond wires, wherein each bond wire extends from one of said joints and electrically connects the joint to a substrate to which the stack is mounted,
   wherein the joints are each comprised of a metal bump of the first semiconductor chip, an electrically conductive portion of an anisotropic conductive film on the second semiconductor chip, and an end of the respective bond wire.

2. The electronic assembly of claim 1, wherein the first and second semiconductor chips are the same size.

3. The electronic assembly of claim 1, further comprising a third semiconductor chip coupled to the second semiconductor chip.

4. The electronic assembly of claim 1, further comprising a third semiconductor chip coupled to the second semiconductor chip.

5. The electronic assembly of claim 3, wherein the first and second semiconductor chips are the same size.

6. The electronic assembly of claim 2, further comprising a third semiconductor chip coupled to the second semiconductor chip.

7. A semiconductor package comprising:

a substrate;

a stack of a first semiconductor chip and a second semiconductor chip mounted to the substrate, with each of the first and second semiconductor chips having a plurality of bond pads, wherein each of the bond pads of the first semiconductor chip faces and is in one of a plurality of electrically conductive joints with a corresponding one of the bond pads of the second semiconductor chip;

a plurality of bond wires, wherein each bond wire extends from one of said joints and electrically connects the joint to the substrate, wherein the joints are each comprised of a metal bump of the first semiconductor chip, an electrically conductive portion of an anisotropic conductive film on the second semiconductor chip, and an end of the respective bond wire; and an encapsulant covering the stack, the bond wires and at least a portion of the substrate.

8. The semiconductor package of claim 7, further comprising a third semiconductor chip stacked with the first and second semiconductor chips and electrically connected to the substrate.

9. The semiconductor package of claim 7, wherein the first and second semiconductor chips are the same size.

10. The semiconductor package of claim 7, wherein the substrate is a metal leadframe.

11. The semiconductor package of claim 7, wherein the stack is supported in a throughhole of the substrate by said encapsulant.

12. The semiconductor package of claim 7, wherein a surface of the first semiconductor chip is exposed through said encapsulant.

13. The semiconductor package of claim 7, wherein the first and second semiconductor chips are identical types, and the bond pads of the second semiconductor chip are a mirror image of the bond pads of the first semiconductor chip.

14. The semiconductor package of claim 7, wherein the first and second semiconductor chips are different types.

15. The semiconductor package of claim 9, further comprising a third semiconductor chip coupled to the second semiconductor chip.

16. An electronic assembly comprising:

a stack of a first semiconductor chip and a second semiconductor chip, with the first and second semiconductor chips each having an active surface with a plurality of bond pads thereon, wherein each of the bond pads of the first semiconductor chip faces a corresponding one of the bond pads of the second semiconductor chip;

a plurality of metal bumps on the bond pads of the first semiconductor chip;

a plurality of bond wires, wherein each bond wire extends from one of said metal bumps and electrically connects the bump to a substrate; and a layer of an anisotropic conductive film coupled between the active surface of the second semiconductor chip and the bumps, said anisotropic conductive film electrically coupling respective ones of the bond pads of the second semiconductor chip to respective ones of the bumps, whereby the first and second semiconductor chips are electrically coupled to each other and to the substrate through the bond wires.

17. The electronic assembly of claim 16, wherein the first and second semiconductor chips are the same size.

18. The electronic assembly of claim 16, further comprising a third semiconductor chip coupled to the second semiconductor chip.

19. The electronic assembly of claim 16, wherein the stack is supported in a throughhole of the substrate by an encapsulant; and said encapsulant covers said stack and said bond wires.

20. The electronic assembly of claim 16, wherein the substrate is a metal leadframe, and further comprising an encapsulant covering said stack and a portion of the leadframe.

21. The electronic assembly of claim 16, further comprising an encapsulant covering said stack and a portion of said substrate.

22. The electronic assembly of claim 16 wherein the first and second semiconductor chips are identical types, and the bond pads of the second semiconductor chip are a mirror image of the bond pads of the first semiconductor chip.

23. The electronic assembly of claim 16, wherein the first and second semiconductor chips are different types.

* * * * *